United States Patent [19]

Nakamura et al.

[11] 4,383,886
[45] May 17, 1983

[54] METHOD OF MANUFACTURING A SEMICONDUCTOR ELEMENT

[75] Inventors: Kisaku Nakamura, Funabashi; Eiji Jimi, Yokohama; Haruyuki Goto, Yokosuka; Akio Hori, Kawasaki, all of Japan

[73] Assignee: Tokyo Shibaura Denki Kabushiki Kaisha, Kawasaki, Japan

[21] Appl. No.: 318,416

[22] Filed: Nov. 5, 1981

[30] Foreign Application Priority Data

Nov. 14, 1980 [JP] Japan ................. 55-160233

[51] Int. Cl.³ ............... H01L 21/312; C23F 1/02
[52] U.S. Cl. ................ 156/659.1; 29/580; 156/656; 156/657; 156/662; 204/32 S; 427/92
[58] Field of Search ............ 204/15, 23, 32 S, 38 B, 204/40, 43 S, 54 R; 252/79.3; 156/648, 649, 656, 657, 661.1, 662; 29/580, 583; 427/88, 89, 98, 92

[56] References Cited

U.S. PATENT DOCUMENTS

| | | |
|---|---|---|
| 3,046,176 | 7/1962 | Bosenberg . |
| 3,288,662 | 11/1966 | Weisberg ................... 156/649 |
| 3,490,140 | 1/1970 | Knight et al. .............. 156/648 X |
| 3,625,837 | 12/1971 | Nelson et al. ............... 204/43 S |
| 3,639,218 | 2/1972 | Missel ........................ 204/40 |

FOREIGN PATENT DOCUMENTS 2028819 6/1970 Fed. Rep. of Germany .

Primary Examiner—William A. Powell
Attorney, Agent, or Firm—Oblon, Fisher, Spivak, McClelland & Maier

[57] ABSTRACT

An improved semiconductor element-manufacturing method which saves a semiconductor wafer from the occurrence of cracks or damage during the manufacture of a semiconductor element and enables solder layers to be deposited without irregularities in the thickness. The method starts with the step of forming a first metal layer acting as an ohmic electrode on each side of the element regions of a semiconductor wafer in which a plurality of active elements are formed or on the whole surface of each side of the semiconductor wafer. Then a second metal layer which has an anticorrosive property and acts as a brazing material when the semiconductor element is mounted between a pair of electrodes is selectively deposited by electroplating on each of the element areas in the first metal layers.

Finally, those portions of the semiconductor wafer which are interposed between the active elements are chemically etched off with the second metal layers used as masks to separate the semiconductor elements from each other, thereby producing a plurality of semiconductor elements, each of which has its surfaces coated with the first and second metal layers.

9 Claims, 9 Drawing Figures

METHOD OF MANUFACTURING A SEMICONDUCTOR ELEMENT

BACKGROUND OF THE INVENTION

I. Field of the Invention

This invention relates to a method of manufacturing a semiconductor element such as a diode or transistor used with a semiconductor device.

II. Description of the Prior Art

The known method of manufacturing a plurality of semiconductor elements by sizing a semiconductor wafer includes the undermentioned method of RCA company (the U.S. Pat. No. 3,046,176). This U.S. patent method comprises the steps of forming a plurality of active elements in a semiconductor wafer 1; a selectively depositing ohmic electrodes on said active elements; dipping the mass in a bath of molten solder to coat a solder layer 3 on each of the ohmic electrodes 2 alone (FIG. 1(a)); dipping the mass in a wafer-etching solution with each solder layer 3 used as a mask; separating those portions of the wafer 1 which are interposed between the respective active elements by chemical etching. By these steps, a semiconductor element 4 comprising the solder layer 3 on each side of the semiconductor wafer 1 with the ohmic electrodes 2 each interposed between the solder layer 3 and semiconductor wafer 1 (FIG. 1(b)) is formed. However, the above-mentioned U.S. patent method has the following drawbacks:

(1) Due to a recent trend to enlarge semiconductor wafer, cracks are likely to arise in the wafer during its dipping in a solder bath. When dipped in a solder bath, a wafer having a larger diameter than 2 inches is subject to great thermal shocks, resulting in the damage of the wafer, the occurrence of cracks therein, a decline in the yield of a semiconductor device and the loss of its reliability.

(2) As seen from FIG. 1(b), a semiconductor element 4 produced has its solder layers 3 raised in the middle due to the surface tension of solder. Where the semiconductor element 4 is set between electrodes 5, then irregularities arise in the thickness of the solder layers 3 coated on both sides of the semiconductor element 4 as illustrated in FIG. 2(b). Further, stresses locally applied to the semiconductor element 4 when mounted between a pair of electrodes given rise to a decline in the property of said semiconductor element 4.

(3) When dipped in a solder bath, the semiconductor wafer 1 is adversely affected by the surface tension of the solder and thermal stresses exerted thereby, presenting difficulties in manufacturing a soldered semiconductor element having a prescribed total thickness.

SUMMARY OF THE INVENTION

It is accordingly an object of this invention to provide a method of manufacturing a semiconductor element which can prevent a semiconductor wafer even having a large size from being damaged during the manufacture of a semiconductor element and suppress the occurrence of cracks in the wafer.

Another object of the invention is to provide a method of manufacturing a semiconductor element which prevents a solder layer from being coated on an element section with irregular thicknesses.

Still another object of the invention is to provide a method of easily manufacturing a soldered semiconductor element having a prescribed total thickness.

To attain the above-mentioned and other objects, this invention provides a method of manufacturing a semiconductor element which comprises the steps of: forming a first metal layer acting as an ohmic electrode by wet plating on each side of a plurality of element sections of a semiconductor wafer or the whole surface of each side of said wafer; selectively depositing by electroplating a single ply second metal layer which has an anticorrosive property and acts as a brazing material when a semiconductor element is mounted between a pair of electrodes, on each of the element areas in the first metal layers; and chemically etching off those portions of the semiconductor wafer which are interposed between the active elements with the second metal layers used as masks to separate the produced element regions from each other, thereby producing a plurality of semiconductor elements, each of which has its surfaces coated with the first and second metal layers.

The foregoing and other objects of the present invention can also be accomplished by providing a method of producing a semiconductor element which comprises the steps of:

forming a first metal layer acting as an ohmic electrode by wet plating on each side of a plurality of element sections of the semiconductor wafer or the whole surface of each side of said wafer;

selectively depositing by electroplating a laminated second metal layer whose outermost layer at least has an anticorrosive property and which acts as a brazing material when the active element is mounted between a pair of electrodes, on each of the element areas in the first metal layers;

chemically etching off those portions of the semiconductor wafer which are interposed between the active elements with the second metal layers used as masks to separate the produced element regions from each other, thereby producing a plurality of semiconductor elements, each of which has its surfaces coated with the first and second metal layers.

DETAILED DESCRIPTION OF THE PREFERRED EMBODIMENTS

Figure 1A:
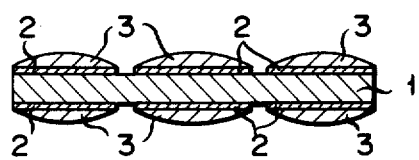
FIGS. 1(a) and 1(b) are cross sectional views of semiconductor elements manufactured by the conventional process of dipping the semiconductor wafer in a bath of molten solder.
Figure 1B:
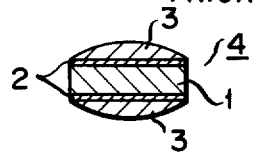

A semiconductor element-manufacturing method embodying this invention starts with the step of depositing a first metal layer acting as an ohmic electrode by a wet plating process on each side of a plurality of active elements such as diodes or transistors formed in a semiconductor wafer or on the whole surface of each side of said wafer. As used herein, the term "wet plating" is defined to mean the process of precipitating or crystallizing out a metal from a solution containing a salt of said metal, and includes both electroplating and electroless plating. The formation of an ohmic electrode by the wet plating process is already known in this particular field. A first metal layer acting as an ohmic electrode which is used in this invention is formed of a single layer of, for example, Ni, Co, Cr, Pt or Au or a laminated layer thereof. This first metal layer acting as an ohmic electrode may be deposited only on the plural element portions of a semiconductor wafer or on the whole surfaces of both sides of the semiconductor wafer. From the standpoint of depositing a second metal layer by electroplating, however, it is preferred to deposit the first metal layer having a high conductivity and capable of acting as a plating electrode on the whole surface of each side of the semiconductor wafer.

A second metal layer acting as a brazing material when a semiconductor element is mounted between a pair of upper and lower electrodes is selectively electroplated on each of the first metal layers. These second layers may be formed of a single ply or multiple ply. When formed of a single ply, the second metal layer should have an anticorrosive property and is preferred to be prepared from a Pb-Sn system or more preferably a Pb-Sn alloy containing particularly 0.6 to 1.5% of Sn. When formed of a multiple layer, each second metal layer should have at least its uppermost ply formed of an anticorrosive material. The preferred types of a laminated second metal layer includes a Pb-In/Pb laminated layer whose inner ply consists of a Pb-In alloy (non-resistant to corrosion) and whose outer ply consists of Pb, and a Pb-Ag/Pb-In/Pb laminated layer whose innermost layer consists of a Pb-Ag alloy, whose intermediate layer consists of a Pb-In alloy and whose outermost layer consists of Pb. The second metal layer can be formed by the known electroplating process. A tetrafluoroborate soldering bath is generally used for the electroplating of the above-listed Pb series solder.

The process of selectively depositing the second metal layer on each of the first metal layers of the element sections includes, for example, the following two processes. The first process comprises the steps of covering each of the first metal layers of the non-element regions with a plating resist; and selectively crystallizing out the second metal layer by electroplating on each of the ohmic electrodes exposed. The material of said plating resist includes organic compounds, for example, a wax of the tar series of paraffin series applied as a photoresist in the ordinary photoetching process. The process of covering the non-element areas in the first metal layers includes a photoetching process and a print process. Since, however, the print process presents difficulties in forming exactly the same pattern at the identical spots on both of the first metal layers, the photoetching process is preferred.

The second process of selectively forming the second metal layer on each of the element areas in the first metal layers comprises the steps of crystallizing out the second metal on the whole surface of each of the first metal layers; covering those portions of the second metal layers which face the respective active elements with an etching resist; and selectively etching off the second metal layers with said etching resist used as a mask, thereby selectively mounting the second metal layer on each of the ohmic electrodes mounted on both sides of the element regions of the wafer. The above-mentioned etching resist may be formed of the same material as that which constitutes the plating resist used in the first process of selectively forming the second metal layer on each of the element areas in the first metal layers. An etchant used in etching the second metal layer includes an aqueous solution of hydrogen peroxide, a mixture of an aqueous solution of hydrogen peroxide and acetic acid, a mixture of an aqueous solution of hydrogen peroxide and lactic acid, and a mixture of an aqueous solution of hydrogen peroxide and glycerin. What is necessary is that hydrogen peroxide be contained in said etchant. Last, those portions of the semiconductor wafer which are interposed between the respective active elements are chemically etched off with the second metal layers used as masks to separate the thus produced element from each other. Where, the first metal layers each acting as an ohmic electrode are deposited on the whole surfaces of both sides of the semiconductor wafer, it is necessary to selectively etch off the non-element areas in the first metal layers and then similarly selectively etch off those portions of the semiconductor wafer which are interposed between said active elements. For the object of this invention, an etchant for the first metal layer may be formed of the known type, and includes various inorganic acids and salts such as $FeCl_3$ which can dissolve a metal. An etchant for the semiconductor wafer should contain hydrofluoric acid. A mixture of hydrofluoric acid and nitric acid can dissolve not only a semiconductor wafer but also a metal. Therefore, an etchant prepared from said mixture can continuously etch both first metal layers and semiconductor wafer at the same time, offering great convenience. The hydrofluoric acid and nitric acid constituting said mixture are preferred to bear a ratio of 1:3 to 1:10 by volume.

This invention will become more apparent with reference to the following examples and accompanying drawing. It will be noted, however, that the examples and drawings are intended for the purpose of illustration only, and consequently the invention should not be construed to be limited thereby, unless otherwise noted.

EXAMPLE 1

Figure 3A:
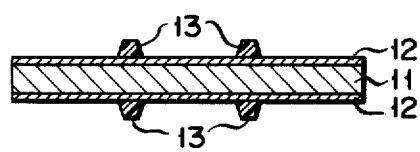
FIGS. 3(a) to 3(c) are cross sectional views showing the sequential steps of manufacturing a diode element in Example 1 of this invention.
Figure 3B:
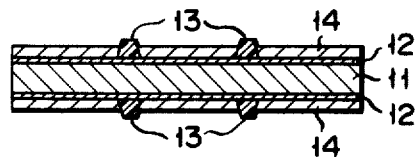
Figure 3C:
Figure 2A:
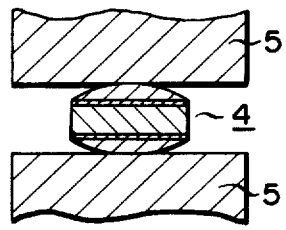
FIGS. 2(a) and 2(b) are cross sectional views showing the respective conventional semiconductor elements mounted between a pair of upper and lower electrodes.
Figure 2B:
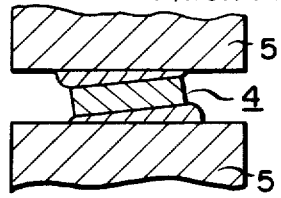

As shown in FIG. 3(a), a Ni layer 12 was formed with a thickness of 1 μm by electroplating using a Watt bath on each side of a silicon wafer 11 which measured 50 mm in diameter and 0.2 mm in thickness and in which a plurality of diodes were formed. After water washing, resist patterns 13 were selectively formed by photoetching on each of the non-element areas in the Ni layers 12. In the next step, a solder layer 14 was selectively deposited with a thickness of 50 μm on each of the element areas in the Ni layers 12 by an electroplating process for an alloy using a tetrafluoroborate solder bath of Pb-1% Sn. In this case, current used for said electroplating indicated 3.5 $A/dm^2$. After the resist patterns 13 were removed, the exposed Ni layers 12 and those portions of the silicon wafer 11 which were interposed between the diodes were chemically etched off by a solution consisting of hydrofluoric acid and nitric acid mixed in the ratio of 1:3 by volume to separate the diodes from each other, thereby forming a plurality of diode elements 15 each covered with the solder layer 14 of Pb-1% Sn on each side of the silicon wafer 11, with the Ni layer 12 (ohmic electrode) interposed between said solder layer 14 and silicon wafer 11 (FIG. 3(c)).

The diode element thus produced was saved from the occurrence of cracks and damage which were observed in the conventional process of simply dipping a semiconductor element in a solder bath. Further, the diode element was freed from the deformation of the PN junction and was possessed of excellent properties. Further, the solder layers had an extremely smooth surface.

EXAMPLE 2

A Ni layer was formed with a thickness of 1 μm on each side of a silicon wafer measuring 50 mm in diameter and 0.2 mm in thickness by the same process as used in Example 1. Resist patterns were formed by photoetching on each of the non-element areas in the Ni layers 12. With the resist patterns used as plating masks, the mass was dipped in a Pb-In alloy-plating bath in which the metal ions had the ratio of 90 g/l In-10 g/l Pb, which was composed of 25 g/l of metal tetrafluoroborate, 25 g/l of ammonium tetrafluoroborate and 0.15 g/l of gelatine, and whose pH value was set at 1.3. A solder layer of 50% Pb-50% In was selectively plated on each of the exposed areas in the Ni layers with a thickness of 45 μm at a current density of 1 A/dm$^2$ by applying an anode of 70% In-30% Pb alloy. Further, Pb was crystallized out from a separately provided tetrafluoroborate solder bath at a current density of 3.5 A/dm$^2$ and coated on the above-mentioned solder layer of 50% Pb-50% In with a thickness of 5 μm. After the resist patterns were removed, those portions of the Ni layers which were interposed between the solder layer and those portions of the silicon wafer which were interposed between the diode elements were chemically etched off by the same etchant prepared from a mixture of hydrofluoric acid and nitric acid as applied in Example 1 to separate the diode elements from each other. Thus formed were a plurality of diode elements, each of which was coated with a laminated Pb-In/Pb solder layer on each side with the Ni ohmic electrode each interposed between said diode element and laminated Pb-In/Pb solder layer. The diode element thus produced was saved from cracks and damage which were observed in the conventional diode element produced simply by being dipped in a solder bath, and was possessed of excellent properties. Further, each solder layer had an extremely smooth surface.

EXAMPLE 3

A Ni layer was deposited by the same process as used in Example 1 with a thickness of 1 μm on the whole surface of each side of a silicon wafer which measured 50 mm in diameter and 0.2 mm in thickness and in which a plurality of diodes were formed. Thereafter a 50% Pb-50% In solder layer was deposited with a thickness of 45 μm on the whole surface of each of the Ni layers by applying the same Pb-In alloy-plating bath as used in Example 2. A Pb layer was deposited with a thickness of 5 μm on each of said solder layers as in Example 2. Thereafter, resist patterns were formed by photoetching on the solder layers partly constituting the diode elements. With said resist patterns used as masks, the areas of the solder layers which cover the non-element section of the wafer were etched off by an etchant prepared from acetic acid and aqueous solution of hydrogen peroxide mixed in the ratio of 3:1 by volume. After removal of the resist patterns, those portions of the Ni layers and those portions of the silicon wafer which were interposed between the diode elements were chemically etched off by an etchant prepared from hydrofluoric acid and nitric acid mixed in the ratio of 1:3, with the laminated solder layers partly constituting the diode elements used as masks, thereby separating the diode elements from each other. As a result, a plurality of diode elements were produced which had the same structure as those obtained in Example 2.

The diode element thus produced was saved from cracks and damage which were observed in a diode element prepared by the conventional process of simply dipping the diode in a solder bath and was possessed of prominent properties. Further, the solder layer had an extremely smooth surface.

Figure 4A:
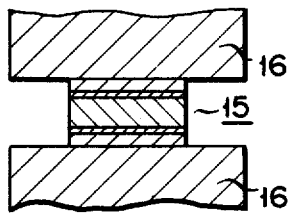
FIGS. 4(a) and 4(b) are cross sectional views illustrating the steps of mounting a semiconductor element produced in any of Examples 1 to 3 of the invention between a pair of upper and lower electrodes.
Figure 4B:
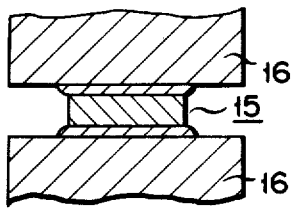

A diode element 15 produced in any of Examples 1 to 3 was mounted, as shown in FIG. 4(a), between a pair of upper and lower electrodes 16. Because the solder layers 14 have extremely smooth surfaces, it was mounted with uniform thickness of the solder layers as indicated in FIG. 4(b). In this case, the diode element was prevented from undergoing local stresses.

As described above, the semiconductor element-manufacturing method of this invention offers the prominent advantages that even where a semiconductor has a large size, the wafer is saved from cracks and damage during the formation of second metal layers or solder layers; the solder layer can be deposited with a smooth surface without giving rise to any change, for example, in the depth of the PN junction; and a semiconductor element of high performance and reliability can be manufactured with prominent yield.

What we claim is:

1. A method of producing a semiconductor element, which comprises the steps of:
    forming a first metal layer acting as an ohmic electrode by wet plating on each side of the element sections of a semiconductor wafer in which a plurality of active elements are formed or the whole surface of each side of said wafer;
    selectively depositing by electroplating a single ply second metal layer which is anticorrosive and acts as a brazing material when a semiconductor element is mounted between a pair of electrodes, on each of the element areas in the first metal layers; and
    chemically etching off those portions of the semiconductor wafer which are interposed between the active elements with the second metal layers used as masks to separate the thus produced elements from each other, thereby producing a plurality of semiconductor elements, each of which has its surfaces coated with the first and second metal layers.

2. A method of producing a semiconductor element which comprises the steps of:
    forming a first metal layer acting as an ohmic electrode by wet plating on each side of the element sections of a semiconductor wafer in which a plurality of active elements are formed or the whole surface of each side of said wafer;
    selectively depositing by electroplating a laminated second metal layer whose outermost layer at least is anticorrosive and which acts as a brazing material when the active element is mounted between a pair of electrodes, on each of the element areas in the first metal layers and;
    chemically etching off those portions of the semiconductor wafer which are interposed between the active elements with the second metal layers used as masks to separate the thus produced elements from each other, thereby producing a plurality of semiconductor elements, each of which has its surfaces coated with the first and second metal layers.

3. The method according to claim 1 or 2, wherein the step of selectively forming the second metal layers by electroplating comprises the steps of:

forming the first metal layer on the whole surface of each side of the semiconductor wafer;

covering the non-element areas in the first metal layers with a plating resist; and crystallizing out the second metal layer each of the exposed areas in the first metal layers by electroplating.

4. The method according to claim 1 or 2, wherein the step of selectively forming the second metal layers by electroplating comprises the steps of:

forming the first metal layer on the whole surface of each side of the semiconductor wafer;

crystallizing out the second metal layer on the whole surface of each of the first metal layers by electroplating;

covering the element areas in each of the second metal layers with an etching resist; and selectively etching off the second metal layers with said etching resist used as masks.

5. The method according to claim 1, wherein the second metal layers are formed of Pb-Sn alloy.

6. The method according to claim 5, wherein the Pb-Sn alloy contains 0.6 to 1.5% by weight of Sn.

7. The method according to claim 2, wherein the second metal layers are layers of Pb-In/Pb or Pb-Ag/Pb-In/Pb.

8. The method according to claim 1 or 2, wherein the chemical etching fluid contains hydrofluoric acid.

9. The method according to claim 1 or 2, wherein the anticorrosive property is defined as resistance to hydrofluoric acid.

* * * * *